United States Patent [19]

Lee et al.

[11] Patent Number: 5,789,275

[45] Date of Patent: Aug. 4, 1998

[54] METHOD FOR FABRICATING A LASER DIODE

[75] Inventors: Soo Won Lee; Gyu Seog Cho; Tae Jin Kim; Kyung Seok Oh, all of Kyoungkido, Rep. of Korea

[73] Assignee: Hyundai Electronics Industries Co., Ltd., Kyoungkido, Rep. of Korea

[21] Appl. No.: 755,816

[22] Filed: Nov. 26, 1996

[30] Foreign Application Priority Data

Dec. 29, 1995 [KR] Rep. of Korea ............... 1995-66039

[51] Int. Cl.$^6$ ........................................... H01L 21/20
[52] U.S. Cl. ........................................... 438/40; 372/45
[58] Field of Search ........................... 438/40, 41, 46, 438/47; 372/44, 45, 46

[56] References Cited

U.S. PATENT DOCUMENTS 4,784,722  11/1988  Liau et al. .

*Primary Examiner*—Charles L. Bowers, Jr.
*Assistant Examiner*—Keith Christianson
*Attorney, Agent, or Firm*—Jacobson, Price, Holman & Stern, PLLC

[57] ABSTRACT

The present invention relates to a method for fabricating a semiconductor laser diode in optical communication system, and the present invention uses both an oxide and a nitride pattern as an etch mask instead of the single oxide pattern in order to decrease the under cut of the edge of the oxide pattern.

9 Claims, 5 Drawing Sheets 5,789,275

1

METHOD FOR FABRICATING A LASER DIODE

FIELD OF THE INVENTION

This invention relates to a method for fabricating a laser diode, and more particularly to a method for fabricating a planar buried heterostructure laser diode("PBH-LD") having improved current blocking layers to decrease leakage current during operation.

BACKGROUND OF THE INVENTION

Generally, in a semiconductor laser diode, in order to achieve reliable device characteristics, for example current confinement, refractive index guide, etc., a mesa structure is useful in consideration of the width of the active layer or the whole device profile.

The conventional method for fabricating the mesa structured laser diode is described hereinafter with reference to the FIG. 1 to FIG. 4, which illustrate the process flow of the conventional method.

First, referring to FIG. 1, an n-InP clad layer 2, an active layer 3 and a p-InP clad layer 4 is successively formed on an n-InP substrate 1.

Next, referring to FIG. 2, an oxide pattern or a nitride pattern 5 is formed on the p-InP clad layer 4. Then, in order to form the mesa structure, the layers 2, 3 and 4 under the oxide pattern 5 is etched with the oxide pattern 5 being used as an etch mask until a portion of the n-InP clad layer 2 is exposed. In this etching process, an under cut is formed under the edge of the oxide pattern 5.

Next, referring to FIG. 3, a p-InP current blocking layer 6 and an n-InP current blocking layer 7, are selectively formed on the side portion of the mesa structure by metal organic chemical vapor deposition("MOCVD") or liquid phase epitaxy("LPE"). In this process, the p-InP current blocking layer 6 is extended to the edge of the oxide pattern 5.

Next, referring to FIG. 4, after removing the oxide pattern 5, a p-contact layer 8 is formed on the p-InP clad layer 4 and the n-InP current blocking layer 7. Then a metal contact layer 9 is formed on the contact layer 8.

However, the above mentioned conventional method for fabricating the mesa structured laser diode has following problems:

The arrows 10 in FIG. 4 denote the directions of the leakage current flow in the p-InP current blocking layer 6 due to the formation of the p - InP current blocking layer 6 under the edge of the oxide pattern 5, which results in the direct contact of the p-InP current blocking layer 6 to the p-contact layer 8. The leakage current also results from the profile of the mesa structure, the size of the under cut and the thickness of the p-contact layer 8. These leakage currents from various sources deteriorate the characteristics, the reliability of the laser diode and the reproducibility of process.

SUMMARY OF THE INVENTION

Therefore, the present invention has been made in view of the above mentioned problem, and the present invention uses both an oxide and a nitride pattern as an etch mask instead of the single oxide pattern 5 in order to decrease the under cut of the edge of the oxide pattern.

In accordance with the present invention, there is disclosed a method for fabricating a laser diode including the

2 steps for: successively forming a first clad layer, an active layer, a second clad layer, a nitride layer and an oxide layer on a semiconductor substrate; forming a predetermined photo resist pattern on the oxide layer; forming an oxide pattern and a nitride pattern by wet etching the oxide layer and the nitride layer, whereby the resulting structure of the oxide and the nitride pattern resembles a hat; forming a mesa structure by etching a predetermined portion of the layers under the nitride layer from the second clad layer to a portion of the first clad layer using the hat-shaped oxide and nitride pattern as an etch mask; etching the oxide and the nitride pattern, whereby the size of the nitride and the oxide pattern are reduced; forming a first and a second current blocking layer on the side portion of the mesa structure; removing the oxide and the nitride pattern; forming a first contact layer on the resulting structure; and forming a second contact layer on the first contact layer.

BRIEF DESCRIPTION OF THE DRAWINGS

A further understanding of the nature and advantage of the present invention will become apparent by reference to the remaining portions of the specification and drawings.

DETAILED DESCRIPTION OF THE PREFERRED EMBODIMENT

A detailed description of an embodiment according to the present invention will be given below with reference to FIGS. 5 to 11.

Figure 1:
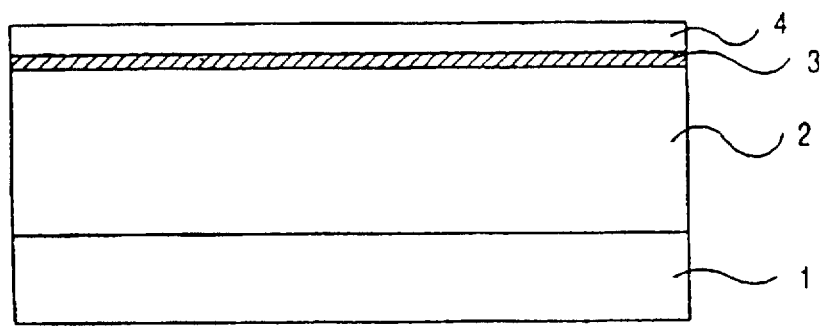
FIGS. 1 to 4 are simplified cross sectional views which illustrate the process flow of the conventional method for fabricating a laser diode.
Figure 2:
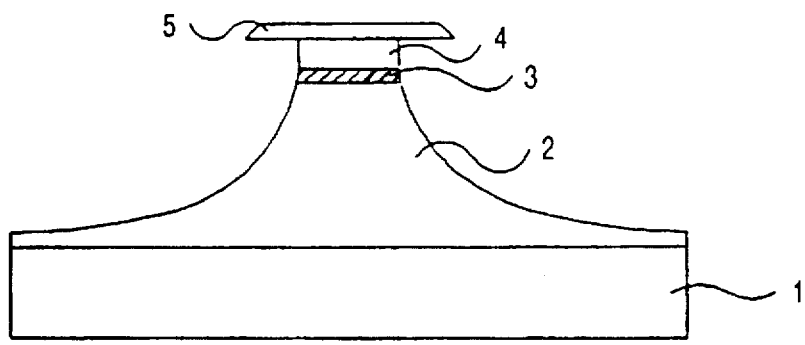
Figure 3:
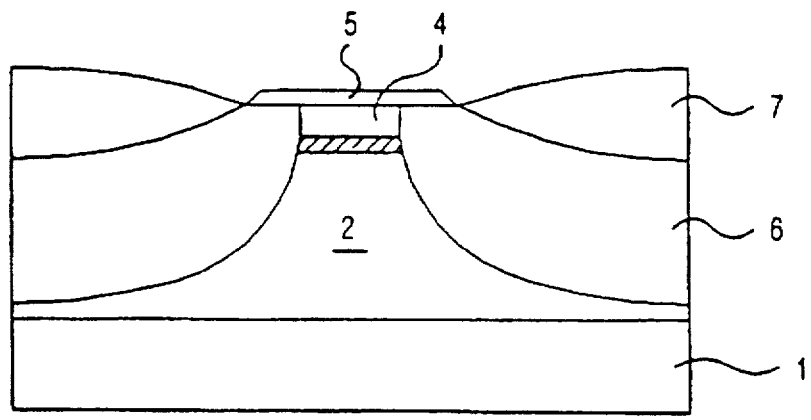
Figure 4:
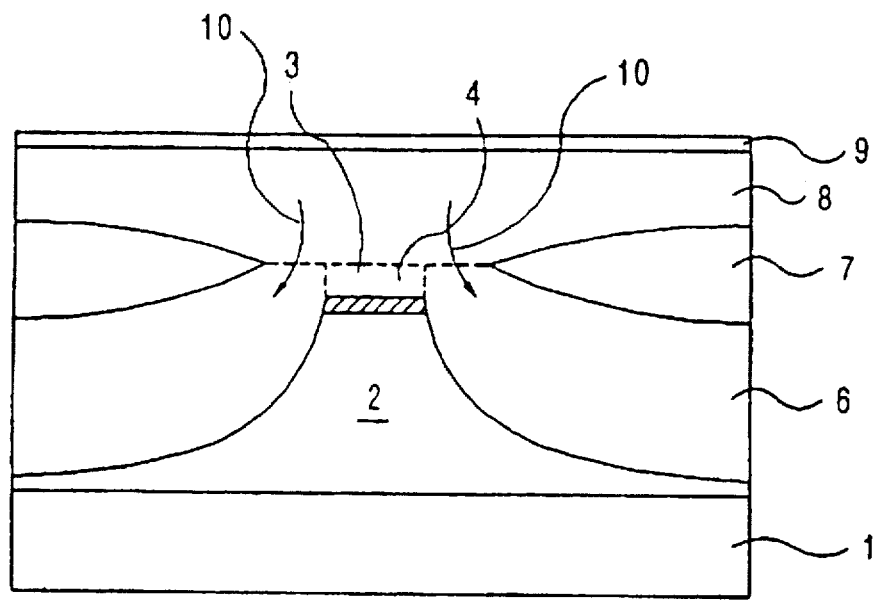
Figure 5:
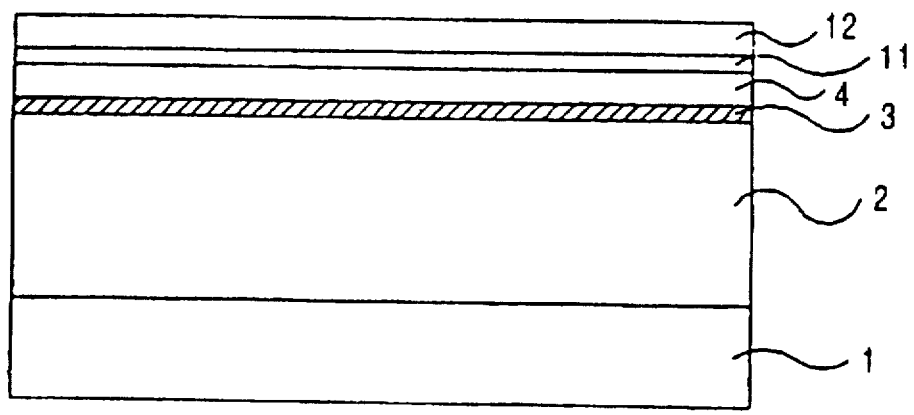
FIGS. 5 to 11 are simplified cross sectional views which illustrate the process flow of the method for fabricating a laser diode according to the present invention.

First, referring to FIG. 5, a first clad layer, for example an n-InP clad layer 2, an active layer 3 and a second clad layer, for example a p-InP clad layer 4, are successively formed on a semiconductor substrate, for example an n-InP substrate 1. Then, a nitride layer 11 is formed on the p-InP clad layer 4 to an exemplary thickness of 200 to 500 Å, and an oxide layer 12 is formed on the nitride layer 11 to an exemplary thickness of 2000 to 3000 Å.

Figure 6:
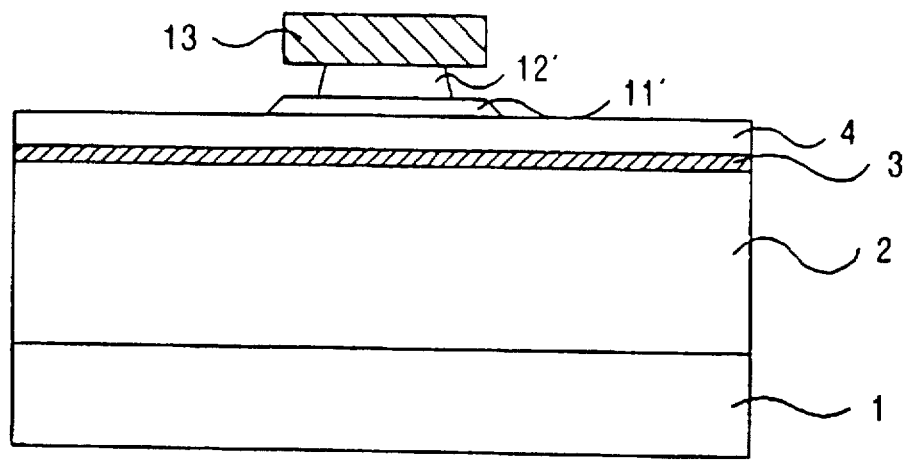

Next, referring to FIG. 6, a predetermined photo resist pattern 13 is formed on the oxide layer 12. Then, an oxide pattern 12' and a nitride pattern 11' are formed by wet etching the oxide layer 12 and the nitride layer 11 with etch solution to which the etch rate of the nitride layer 11 is smaller that that of the oxide layer 12, whereby the resulting structure of the nitride and the oxide pattern 11' and 12' resembles a hat.

Figure 7:
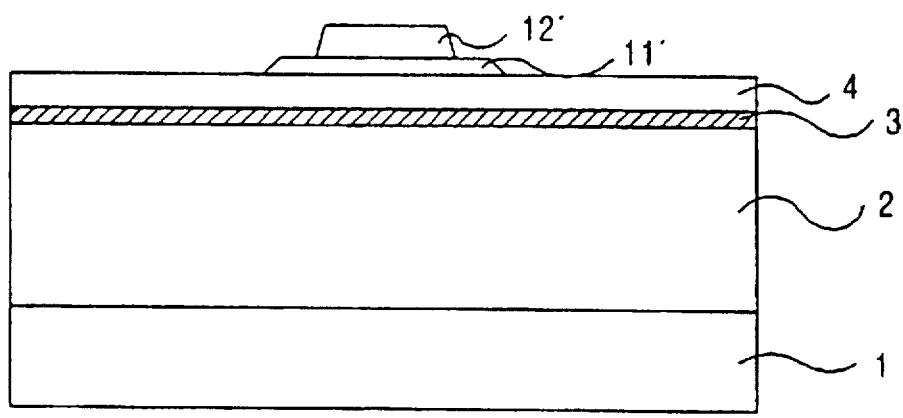

Next, referring to FIG. 7, the photo resist pattern 13 is removed.

Figure 8:
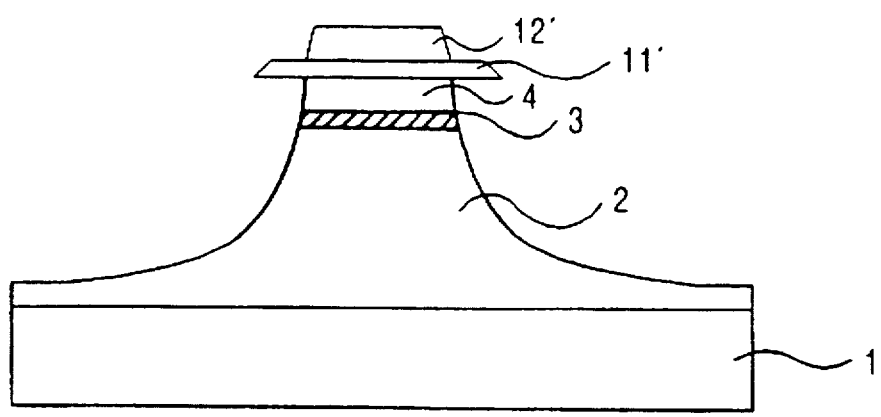

Next, referring to FIG. 8, a mesa structure is formed by etching a predetermined portion of the layers under the nitride layer from the p-InP clad layer 4 to a portion of the n-InP clad layer 2 using the hat-shaped pattern 11' and 12' as an etch mask. In this process, an under cut is formed under the edge of the nitride pattern 11.

Figure 9:
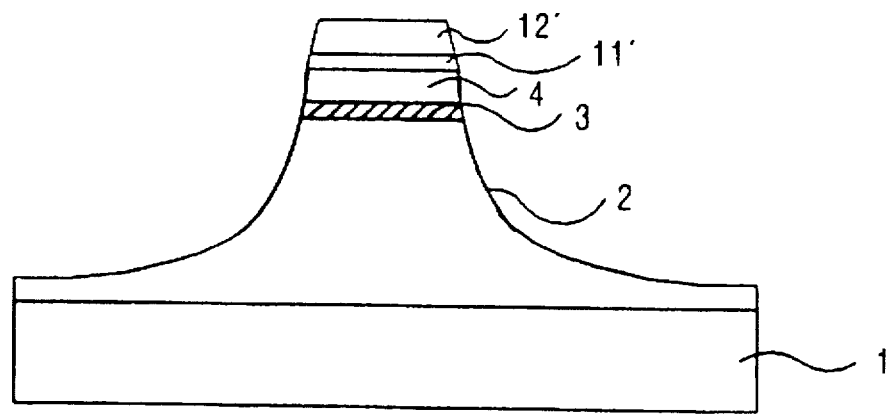

Next, referring to FIG. 9, the oxide pattern 12' and the nitride pattern 11' are etched by applying a dry etching to which the etch rates of the two layers are substantially the same, whereby the under cut is reduced or substantially eliminated.

Figure 10:
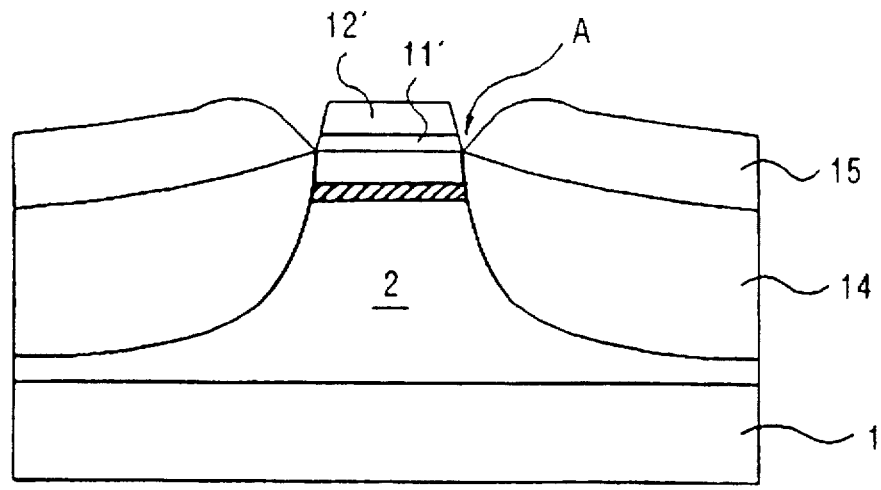

Next, referring to FIG. 10, a first and a second current blocking layer, for example a p-InP layer 14 and an n-InP layer 15 are formed on the side portion of the mesa structure.

Figure 11:
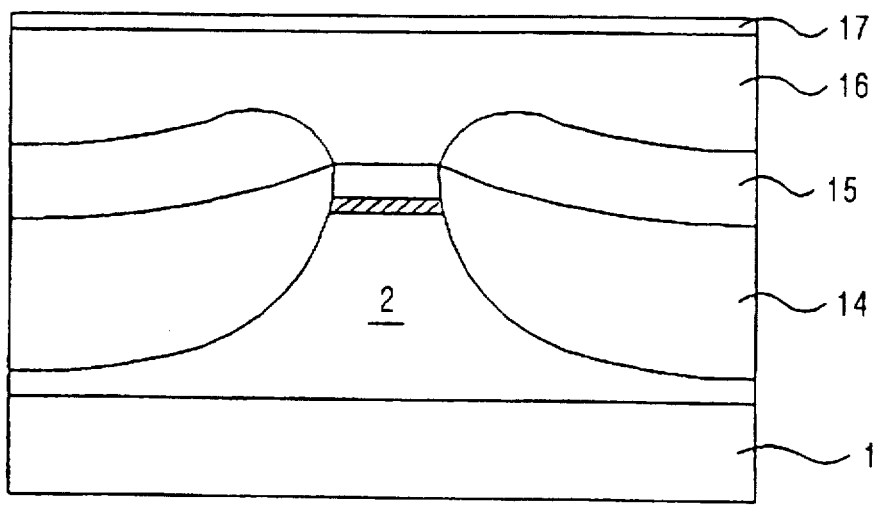

Finally, referring to FIG. 11, after removing the oxide and the nitride pattern 12' and 11', a first contact layer, for example a p - contact layer 16 is formed on the resulting structure, and a second contact layer, for example a metal layer 17 is formed on the p-contact layer 16.

As described above, according to the present invention, the leakage current path is noticeably eliminated in the neighborhood of the area marked as "A" in FIG. 10 because the current blocking layers are formed with the under cut being reduced or substantially eliminated. Also, the current blocking layers 14 and 15 are formed to have improved profile without the effect of the process variations, for example the profile of etched mesa structure, the size of the under cut and the thickness of the current blocking layer. Furthermore, a more controllable current injecting opening can be achieved. These advantages result in the decrease of the leakage currents in the current blocking layers, whereby the device characteristics, the reliability and the reproducibility of process are improved.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A method for fabricating a laser diode comprising said steps for:

successively forming a first clad layer, an active layer, a second clad layer, a nitride layer, and an oxide layer on a semiconductor substrate;

forming a predetermined photo resist pattern on said oxide layer;

forming an oxide and a nitride pattern by wet etching said oxide and said nitride layer, whereby the resulting structure of said oxide and said nitride pattern resembles a hat;

forming a mesa structure by etching a predetermined portion of said layers under said nitride layer from said second clad layer to a portion of said first clad layer using said hat-shaped oxide and nitride pattern as an etch mask;

etching said oxide and said nitride pattern, whereby the size of said nitride and said oxide pattern are reduced;

forming a first and a second current blocking layer on the side portion of said mesa structure;

removing said oxide and said nitride pattern;

forming a first contact layer on the resulting structure; and forming a second contact layer on said first contact layer.

2. A method as claimed in claim 1, wherein said step for forming an oxide and a nitride pattern is performed by wet etching with etch solution to which the etch rate of said nitride layer is smaller than that of said oxide layer.

3. A method as claimed in claim 1, wherein said step for etching said oxide and said nitride pattern is performed by applying a dry etching to which the etch rates of said two layers are substantially the same.

4. A method as claimed in claim 1, wherein said first clad layer is an n-InP clad layer.

5. A method as claimed in claim 1, wherein said second clad layer is a p-InP clad layer.

6. A method as claimed in claim 1, wherein said first current blocking layer is a p-InP layer.

7. A method as claimed in claim 1, wherein said second current blocking layer is an n-InP layer.

8. A method as claimed in claim 1, wherein said first contact layer is a p-contact layer.

9. A method as claimed in claim 1, wherein said second contact layer is a metal contact layer.

* * * * *